United States Patent [19]

Kishii

[11] Patent Number: 5,227,339
[45] Date of Patent: Jul. 13, 1993

[54] METHOD OF MANUFACTURING SEMICONDUCTOR SUBSTRATE AND METHOD OF MANUFACTURING SEMICONDUCTOR DEVICE COMPOSED OF THE SUBSTRATE

[75] Inventor: Sadahiro Kishii, Isehara, Japan

[73] Assignee: Fujitsu Limited, Kawasaki, Japan

[21] Appl. No.: 701,809

[22] Filed: May 17, 1991

[30] Foreign Application Priority Data

May 18, 1990 [JP] Japan .................. 2-129725
Sep. 7, 1990 [JP] Japan .................. 2-237775

[51] Int. Cl.⁵ .................. H01L 21/302; H01L 21/463
[52] U.S. Cl. .................. 437/225; 437/226; 437/249; 437/946; 156/645; 156/626
[58] Field of Search .................. 437/225, 226, 249

[56] References Cited

U.S. PATENT DOCUMENTS 4,638,552 1/1987 Shimbo et al. .................. 437/225
5,051,378 9/1991 Yagi et al. .................. 437/225

OTHER PUBLICATIONS

S. Wolf and R. Tauber, Semiconductor processing for the VLSI era, 1986, pp. xxii–xxiv.
R. C. Frye et al., J. Electrochemical Soc. 133, 1673, 1986.
J. B. Lasky, Appl. Phys. Lett. 48, 78, 1986.

Primary Examiner—Olik Chaudhuri
Assistant Examiner—H. Jey Tsai
Attorney, Agent, or Firm—Staas & Halsey

[57] ABSTRACT

Disclosed is a method of manufacturing a semiconductor wafer or SOI substrate having a total thickness variation (TTV) of 1 micrometer or less which is required to make a future semiconductor integrated circuit of high density. A semiconductor crystal disk made by slicing a semiconductor crystal ingot is flattened by being subjected to a flattening step such as a grinding, chemical-mechanical polishing or the like and then subjected to a step for providing an asymmetric configuration such as an orientation flat (OF) and the like. With this process, the deterioration of flatness due to the presence of the OF and the like can be prevented. Further, a flattening step conventionally carried out by lapping is replaced by surface grinding, by which the flatness of a wafer is improved and an etching step following the lapping can be omitted. The introduction of this process enables semiconductor wafers having a TTV of 1 micrometer or less and a diameter of 6 inches to be obtained at a yield of 90% or more. In addition, the above method can also be applied to an SOI substrate composed of two silicon wafers bonded through an insulating layer to uniformly thin one of the silicon wafers to a few micrometers, whereby the practical use of a semiconductor integrated circuit of a SOI structure will be accelerated.

12 Claims, 11 Drawing Sheets

WITHOUT OF

WITH OF

ORIENTATION FLAT (OF)

METHOD OF MANUFACTURING SEMICONDUCTOR SUBSTRATE AND METHOD OF MANUFACTURING SEMICONDUCTOR DEVICE COMPOSED OF THE SUBSTRATE

BACKGROUND OF THE INVENTION

1. Field of the Invention

The present invention relates to a semiconductor substrate provided with a positioning means such as a so-called orientation flat (OF) or notch and to a semiconductor device made by using such a substrate.

As time passes, semiconductor devices tend to be more densely integrated, operated at a higher speed and made smaller in size at an increasing speed and accordingly the size of a pattern of elements constituting the semiconductor device is reduced, which requires a wafer to have a flat surface and a uniform thickness of 1 micrometer or less. Further, an approach using a substrate composed of two silicon wafers bonded through an insulating layer is most promising at present for providing a semiconductor device of high performance based on a so-called silicon on insulator structure (SOI) technology, in which one of the silicon wafers of the substrate must be thinned to a few micrometers.

2. Description of the Related Arts

A semiconductor wafer arranged as described above is usually made by the process shown in FIG. 1, wherein (a) an ingot of a single crystal semiconductor having a desired composition is pulled up by a Czochralski method; (b) the ingot is roughly cut to a suitable length; (c) the outer surface of the ingot is processed to have a cylindrical shape and further a plane parallel to the axis of the cylinder is formed on the side thereof, the plane serving as an orientation flat (OF) into be described later; (d) the above ingot is sliced to many disks by a rotary blade type slicer; (e) the circumference thereof is beveled; (f) at least the surface thereof where a semiconductor device is to be formed is subjected to lapping; (g) the disk is etched with a chemical solution; (h) the disk is then mirror finished by a so-called chemical-mechanical polishing; and finally (i) the disk is cleaned. The mirror finished surface has flatness and crystallinity suitable to form a semiconductor device. The semiconductor wafer made by the above process is a disk having a straight cutout or orientation flat (OF) defined along a portion of the circumference thereof.

Although the etching at step (g) is carried out to remove crystal defects made on the wafer surface by the lapping at step (f), the flatness of the disk becomes deteriorated or sloped by a different etching speed on the surface thereof caused by the nonuniform circulation or distribution and varying temperature of the chemical or etching solution. However, the flatness is recovered by the polishing at step (h).

Nevertheless, the flatness of the semiconductor wafer made by the above process is limited to about 2 micrometers in terms of the value of a total thickness variation (TTV) which is a difference between the maximum and minimum thickness of the wafer. Accordingly, the yield of wafers which satisfy the requirement of the flatness of 1 micrometer or less as described above is very low. This makes it difficult for bonded wafers to be uniformly thinned to a few micrometers or less in the process of making an SOI structure.

SUMMARY OF THE INVENTION

An object of the present invention is to provide a practical method by which a semiconductor wafer having high flatness, specifically a TTV value of 1 micrometer or less can be fabricated at a good yield.

A further object of the present invention is to provide a method by which one of the wafers in a substrate having an SOI structure composed of two semiconductor substrates bonded through an insulating layer can be formed to a uniform thickness of a few micrometers or less.

To achieve these objects, first the present invention is characterized in that an asymmetric configuration such as an OF or notch provided to indicate the crystallographic direction of the semiconductor wafer is formed after the above flattening process has been carried out. Therefore, an asymmetric configuration such as the OF or the like is processed to one or both of the wafers in the above substrate having the SOI structure after the wafer on which a semiconductor device is to be formed has been subjected to a flattening process or mirror finish process. Second, the present invention is characterized in that a surface grinding is used in place of a conventional lapping and subsequent etching to flatten a disk made by slicing a semiconductor crystal ingot.

BRIEF DESCRIPTION OF THE DRAWINGS

FIGS. 7A and 7B are schematic perspective views showing an example of the deteriorated flatness of semiconductor wafers by the presence of an OF.

FIGS. 8A to 8D are schematic plan views explaining a mechanism for the deterioration of the flatness of a semiconductor wafer due to the presence of an OF;

DESCRIPTION OF PREFERRED EMBODIMENT

Figure 1:
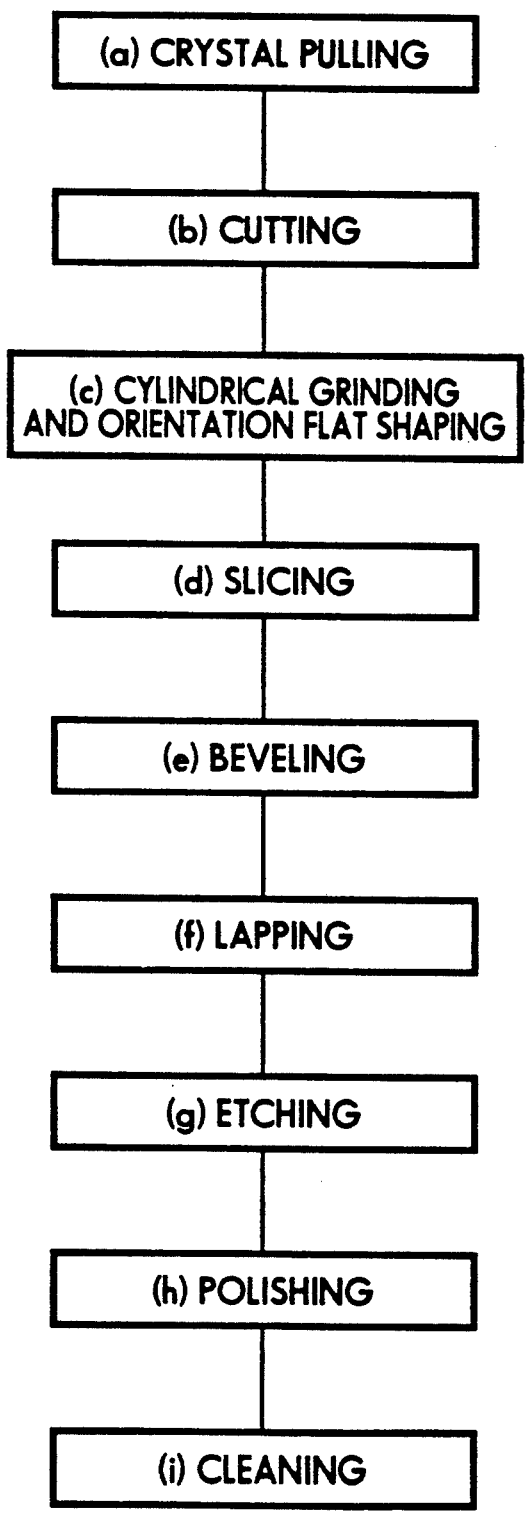
FIG. 1 is a flow chart explaining a conventional process for fabricating a semiconductor wafer.

The inventors have obtained the following information from a preliminary study for improving the flatness of a semiconductor wafer:

i) when silicon wafers are subjected to a surface grinding using a grindstone in place of the lapping at step (f) of the above conventional process, illustrated in FIG. 1, good flatness can be obtained, and when a grindstone having a small grain size is used, a surface having less residual crystal distortion can be obtained as compared with that obtained by the lapping; and ii) the triangular region defined by the OF and the lines connecting the center of a semiconductor wafer and the ends of the OF tends to be relatively thinner.

The above information implies that the time during which the etching is carried out at step (g) of the above conventional process may be shortened or the etching itself may be omitted and further the thickness of the wafer surface which is thinned by the polishing at step (h) may be further reduced by the employment of surface grinding. It is also implied that an asymmetric configuration such as the OF may act to deteriorate the flatness of the wafer surface in the process of flattening or mirror finishing the semiconductor wafer.

Figure 2:
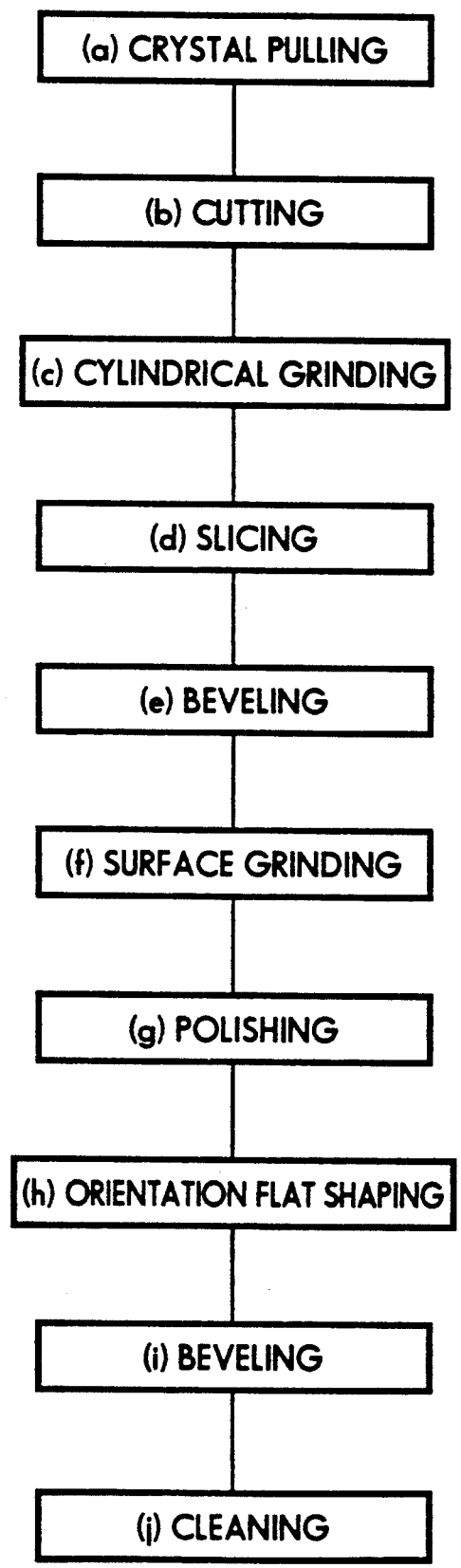
FIG. 2 is a flow chart explaining an embodiment of a process for fabricating a semiconductor wafer according to the present invention.

Therefore, the inventors have changed the process of fabricating a semiconductor wafer to the process shown in the flow chart of FIG. 2, wherein the crystal pulling at step (a) to the cylindrical shaping of the ingot at step (c) are identical to those of FIG. 1 except that the shaping of a plane to be used as an OF at step (c) is omitted. The following sequence: (d) slicing the ingot into disks of semiconductor crystal; (e) beveling the circumference of the disk; (f) grinding the surface of the disk by a grindstone; (g) polishing the ground surface by a chemical-mechanical polishing; (h) providing the disk with an asymmetric configuration such as the OF; (i) beveling the OF portion; and finally, (j) cleaning the disk.

As described above, the process according to the present invention is mainly different from the above conventional process in that the surface grinding is carried out at step (f) of FIG. 2 in place of the lapping at step (f) and the etching at step (g) of FIG. 1. In addition in FIG. 2, the OF is formed after the surface grinding at step (f) and polishing at step (g) have been carried out.

Figure 3A:
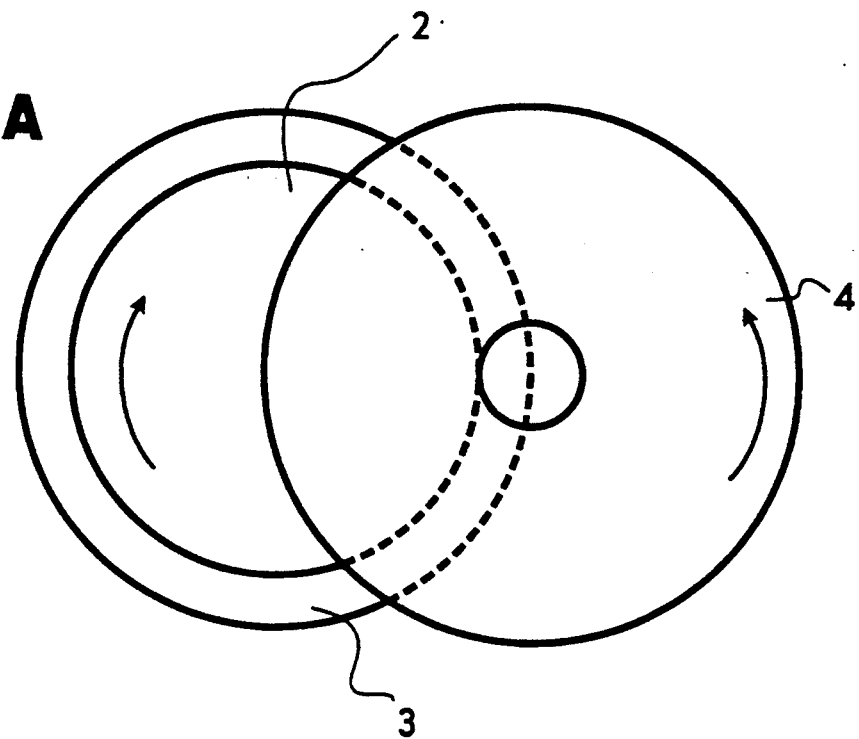
FIGS. 3A and 3B are schematic diagrams explaining the principle of surface grinding.
Figure 3B:
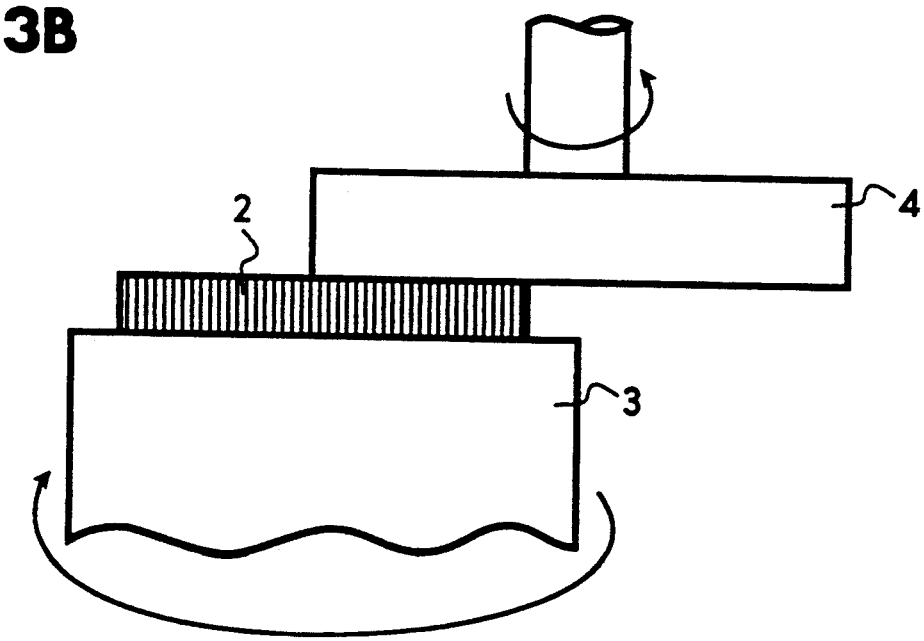

According to the present invention, the surface of the sliced semiconductor crystal disk is ground using means such as a grindstone to a substantially predetermined thickness and flatness. FIG. 3A is a schematic plan view and FIG. 3B is a side view explaining the surface grinding, wherein a semiconductor crystal disk (wafer) 2 fixed on a stage 3 rotating clockwise is ground by a grindstone 4 rotating counterclockwise.

Figure 4:
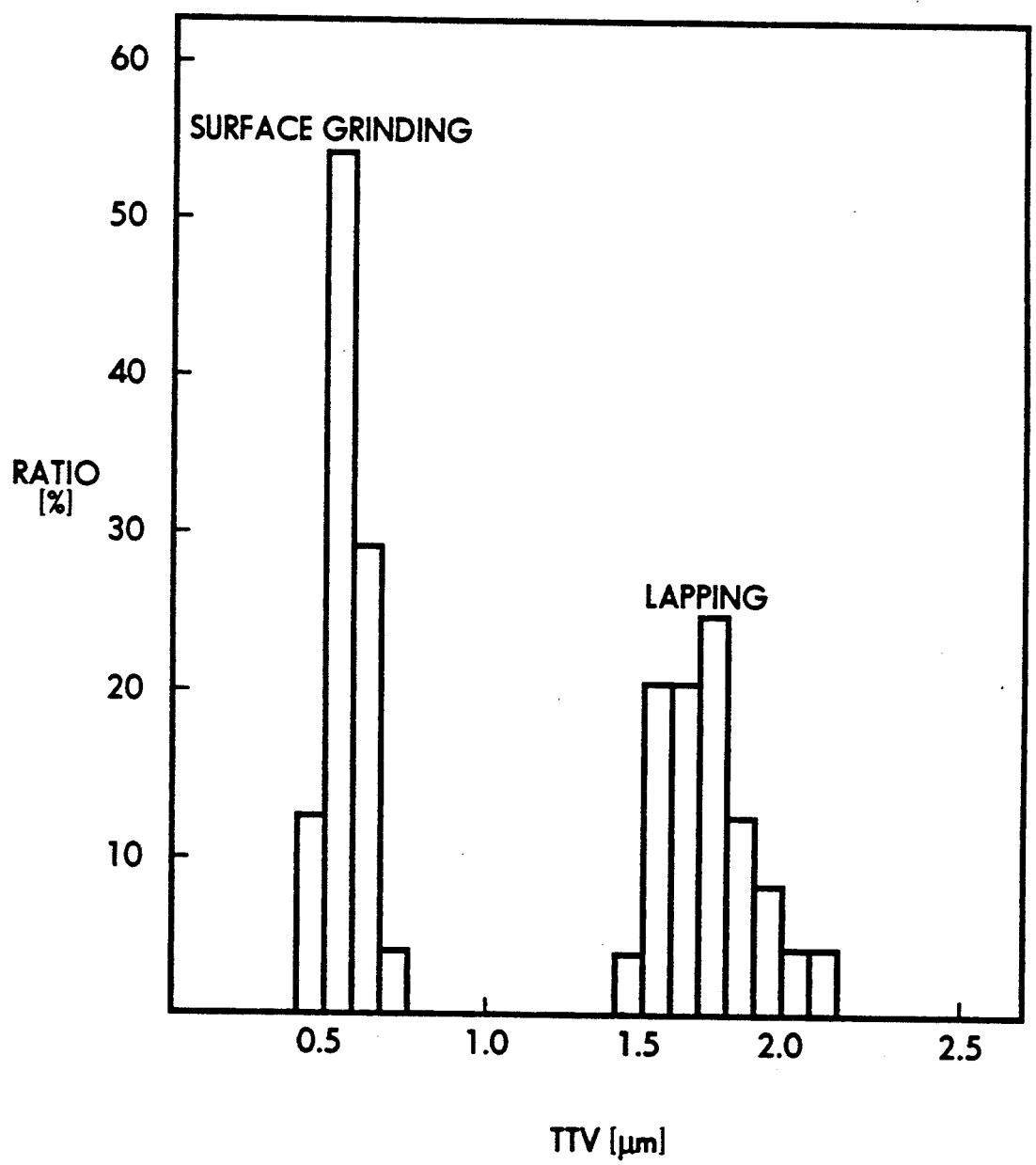
FIG. 4 is a graph explaining the improvement in the flatness of semiconductor wafers by using a surface grinding.

FIG. 4 is a graph showing the improvement in the flatness realized by the above surface grinding as compared with the flatness of a semiconductor wafer subjected to the conventional lapping and etching, wherein the abscissa represents flatness in terms of TTV and the ordinate represents the ratio (%) of the number of semiconductor wafers, respectively. The above surface grinding was carried out using a high precision surface grinder from Sibayama Kikai KK (Osaka, Japan). The grindstone used was 150 cm in diameter and abrasive mesh about 8 micrometers. FIG. 4 shows the result obtained from that silicon wafers having a diameter of 6 inches and a thickness of about 800 micrometers just after being sliced which were surface by a thickness of 40 micrometers. Note that the specimens processed by the conventional process were silicon wafers having the same above dimensions and both sides thereof were lapped by a thickness of about 40 micrometers. The wafers of both groups were provided with an OF having a length of 55.5 mm.

As shown in the figure, the flatness of the lapped wafer surfaces distributes or varies in the range of 1.5 to 2.2 micrometers, whereas the flatness of the surface ground wafer distributes in the range of 0.5 to 0.8 micrometer. More specifically, it is found that better flatness can be obtained by the surface grinding and the flatness is less dispersed or more uniform among the wafers subjected to grinding.

Figure 5A:
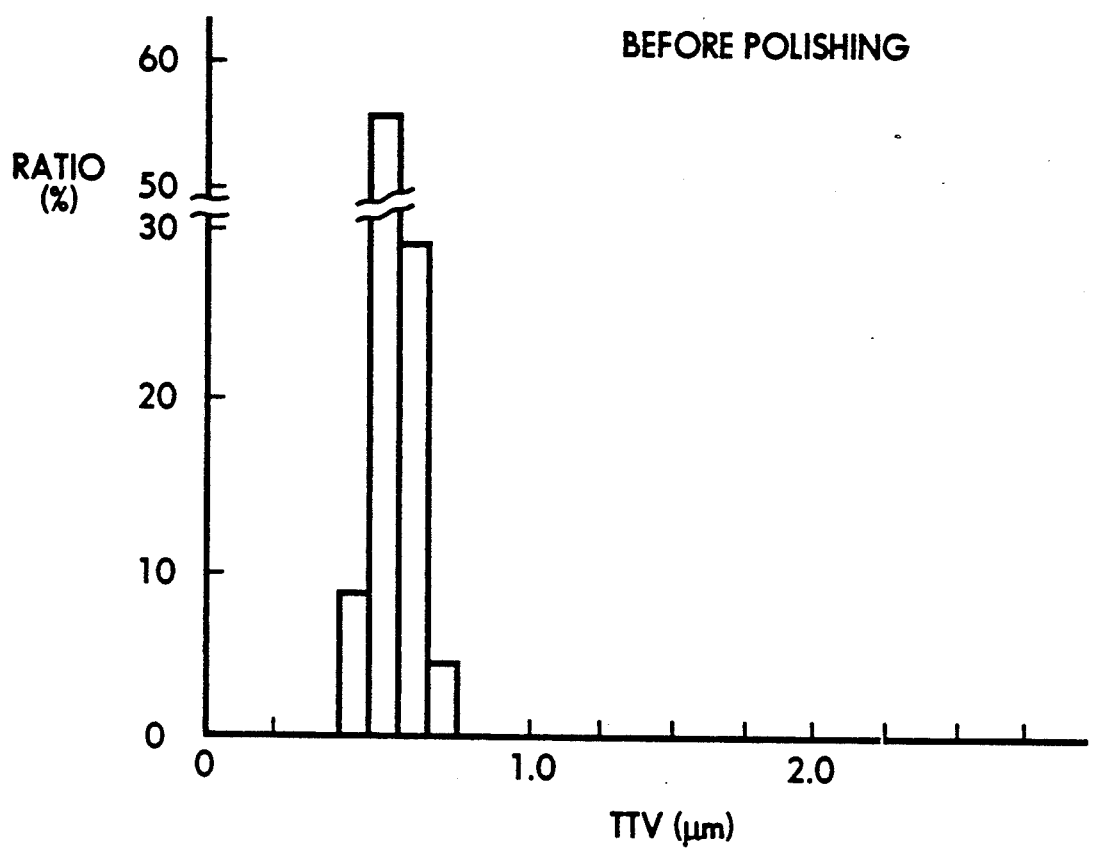
FIGS. 5A and 5B are graphs explaining the deterioration or degradation of the flatness of semiconductor wafers by chemical-mechanical polishing.
Figure 5B:
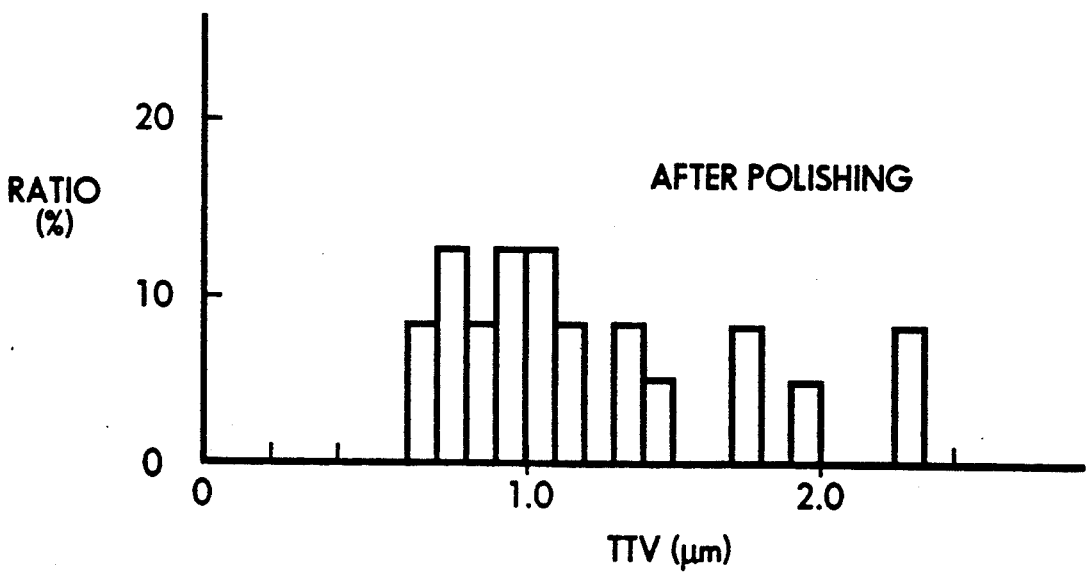

When the above surface ground wafers are subjected to the chemical-mechanical polishing at step (f) of FIG. 2, however, the flatness thereof is deteriorated, as shown in FIGS. 5A and 5B. FIG. 5A is a graph showing the distribution of flatness of the semiconductor wafers just after being surface ground and FIG. 5B shows the distribution of flatness thereof after being surface ground and then polished, respectively. In FIGS. 5A and 5B the abscissa represents flatness in terms of TTV and the ordinate represents a ratio (%) of the number of semiconductor wafers, respectively. Note that FIGS. 5A and 5B show the result obtained from a sample size of 192 silicon wafers each having a diameter of 6 inches and polished by 40 to 50 micrometers in thickness, respectively.

As shown in FIG. 5A the TTV of the wafers just after being surface ground is within the range of 0.4 to 0.8 micrometers and has an average value of 0.58 micrometers. However, in FIG. 5B the TTV of the polished wafers distributes in the range of 0.6 to 2.3 micrometers and has an average value of 1.21 micrometers. In the latter case, the number of the wafers having TTV of 1 micrometer or less is only 42% of the total number. However, the improvement achieved by the surface grinding is apparent in comparison with the usual finished (lapped and polished) wafers which have the distribution of TTV from 2.0 to 3.0 micrometers.

Figure 6A:
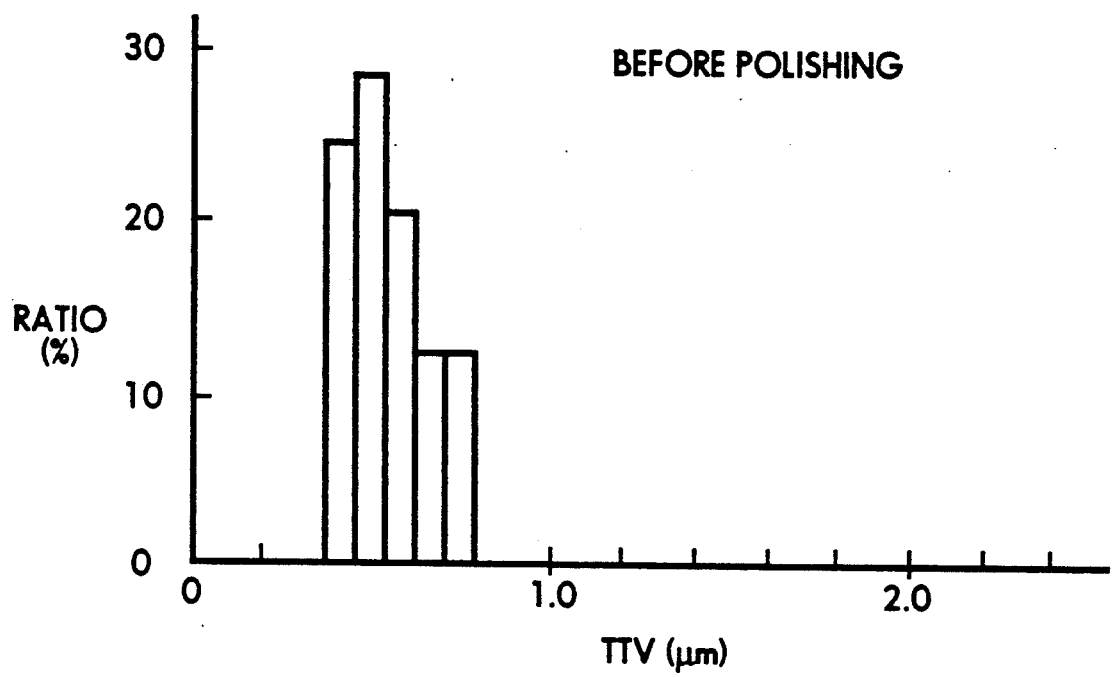
FIGS. 6A and 6B are graphs showing the change of the flatness of semiconductor wafers without an OF by a chemical-mechanical polishing.
Figure 6B:
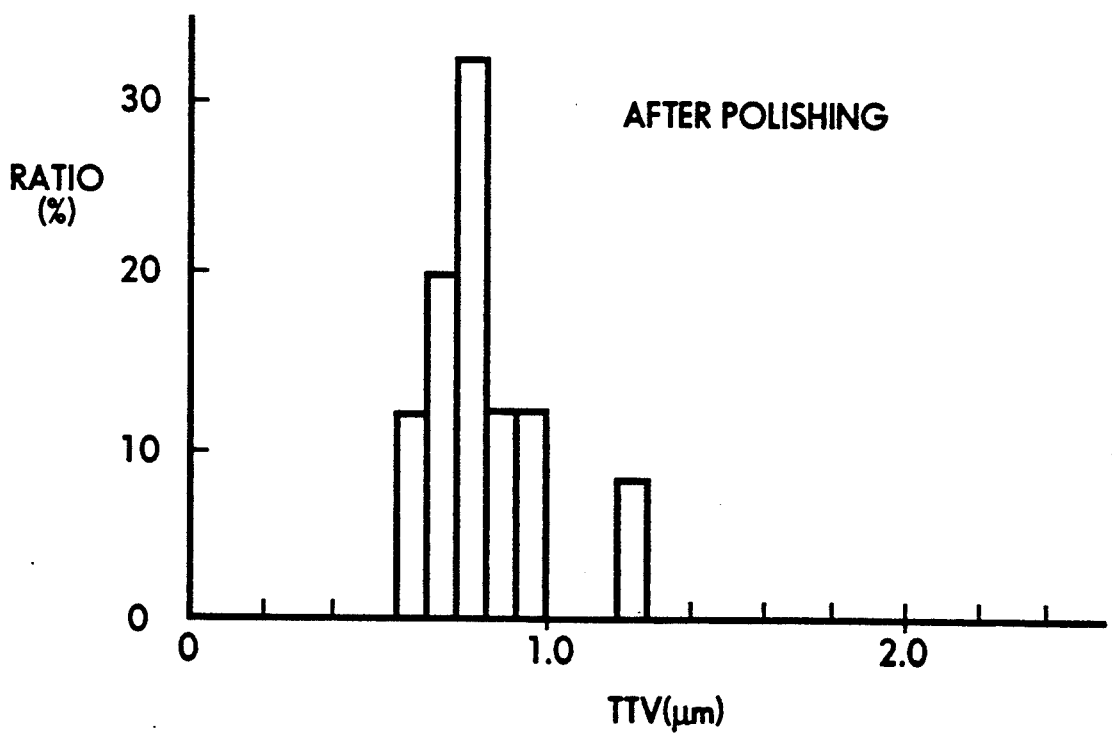

The above result suggests that when a semiconductor wafer is flattened or polished, asymmetry such as the OF may act to deteriorate flatness. Therefore, the inventor prepared silicon disks having a diameter of 6 inches and a thickness of 800 micrometers obtained by slicing an ingot without a plane formed on the side thereof for constituting OF, as described above. The disks are subjected to surface grinding, and then to chemical-mechanical polishing. FIGS. 6A and 6B show the flatness of these disks (wafers), wherein FIG. 6A shows the TTV distribution from a sample size of 192 surface ground semiconductor wafers before the polishing. FIG. 6B shows the TTV distribution of the these semiconductor wafers after being polished by 40 to 50 micrometers in thickness.

As shown in FIGS. 6A and 6B, the TTV of the wafers before being polished distributes in the range of 0.4 to 0.9 micrometer and has an average value of 0.61 micrometer, whereas the TTV of the wafers after being polished distributes in the range of 0.5 to 1.3 micrometers and has an average value of 0.80 micrometers. However, 92% of the polished wafers have TTV of 1 micrometer or less. The flatness of the wafers surface ground without being provided with the OF is also deteriorated by the polishing, but it is apparent from the comparison of FIG. 6B with FIG. 5B that when the wafers not provided with the OF are surface ground, the deterioration of the flatness thereof caused by the polishing is greatly reduced.

Figure 7A:
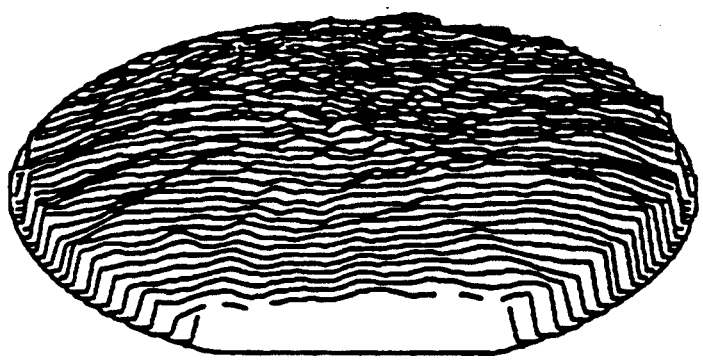
Figure 7B:
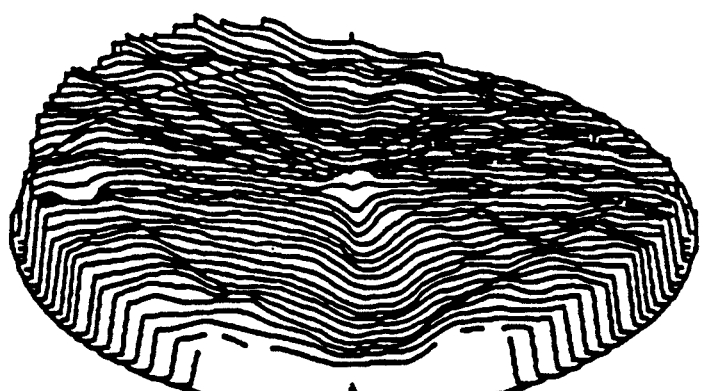

FIGS. 7A and 7B are schematic perspective views showing an example of the distribution of the measured heights of a wafer surface just after being surface ground, wherein FIG. 7A shows a wafer not provided with the OF (although the wafer is not actually provided with the OF, the OF is illustrated for the convenience of a measuring instrument) and FIG. 7B shows a wafer provided with an OF. The wafer surfaces have a TTV of 0.54 micrometers and 0.58 micrometers, respectively and no difference is admitted therebetween. In FIG. 7A in which no OF is provided, however, any particular non-flatness is not shown on the surface, whereas in FIG. 7B in which the OF is provided, the presence of recesses expanding from the center of the wafer toward the OF is apparently observed. Thus, it is found that although the effect of the OF does not eminently appear to the TTV, the OF affects the flatness.

Figure 8A:
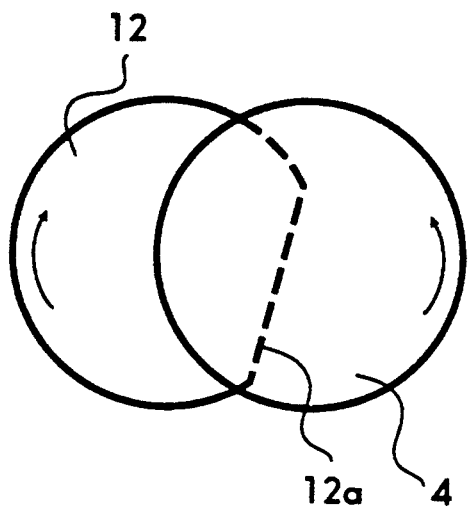
Figure 8B:
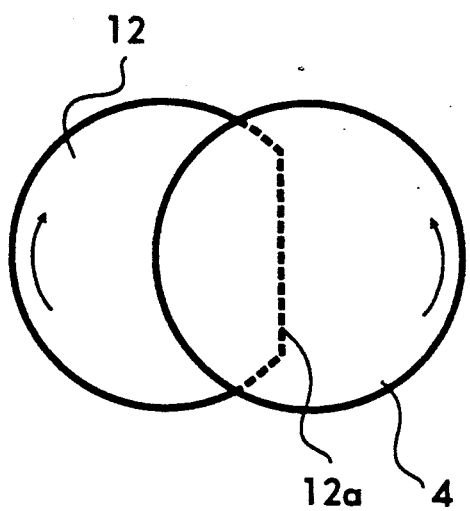
Figure 8C:
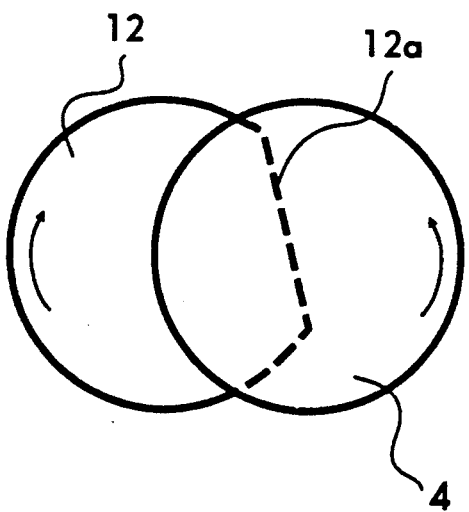
Figure 8D:
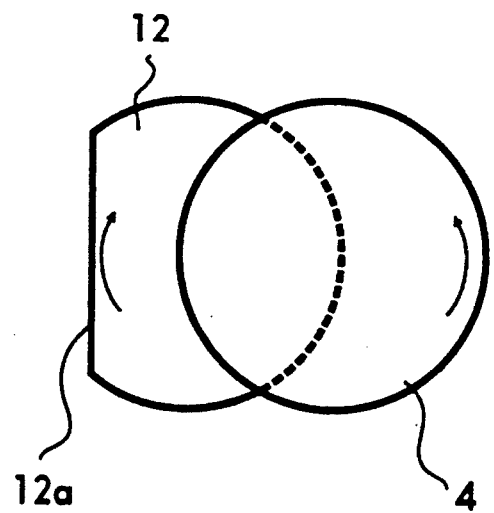

The above relationship between the flatness of the wafer and the OF can be understood as follows with reference to FIGS. 8A through 8D. That is, it is assumed that the area of a wafer 12 in contact with a surface grindstone 4 is different during the period which an OF 12a overlaps the surface grindstone 4 as shown in FIGS. 8A to 8C, and the period during which the OF 12a does not overlap the surface grindstone 4 as shown in FIG. 8D. Accordingly, a non-uniform pressure is applied to the wafer 12, and the triangular region defined by the OF 12a and the lines connecting the center of the wafer 12 and the ends of the OF 12a tends to be relatively thinner. A similar problem also arises in the above chemical-mechanical polishing in which a polishing cloth and abrasive grains are pressed against a wafer surface.

As shown in FIGS. 6A and 6B, when the OF is not provided, a given area of the wafer always comes into contact with the grindstone or a surface plate, and thus the uniformity in thickness is improved with the result that the TTV is made smaller. Note, at present the reason why the presence of the OF does not greatly affect the surface ground wafer but does greatly affect the polished wafer is not apparent.

From the above result, the surface flatness of most semiconductor wafers can be made to 1 micrometer or less in terms of TTV by surface grinding. Further, the use of a less coarse surface grindstone can reduce the crystal distortion made on a wafer surface. Therefore, a subsequent chemical-mechanical polishing may be carried out in a minimum amount sufficient to remove the greatly reduced crystal distortion from the wafer surface. Further, the conventional lapping and etching using an etchant can be substantially omitted.

FIG. 2 shows a flow in which the OF is formed on the wafer after the surface grinding and subsequent polishing as described above. Since a surface having good flatness is formed by the surface grinding, an amount of thickness lost in the subsequent polishing can be reduced. This means that even if the OF is formed following the surface grinding and thereafter polishing the deterioration of the flatness can be sufficiently restricted or minimized to a low level. Alternately, a method may be employed by which a coarse polishing of about 10 micrometers in thickness is carried out prior to the formation of the OF, and thereafter, a final polishing of about 0.5 micrometer in thickness is carried out after the formation of the OF.

The OF is formed by a method as described below to the semiconductor wafer having been subjected to the above surface grinding or polishing. More specifically, an adhesive tape is applied to the back surface of the wafer, the wafer is fixed to the stage of a dicer through the adhesive tape by vacuum, and then the edge of the round wafer is entirely cut off at a speed of about 50 mm/min using the cutter of a dicer, similarly to a dicing process by which a wafer is cut off into chips. The cutting time per wafer is about 1 minute.

Figure 9:
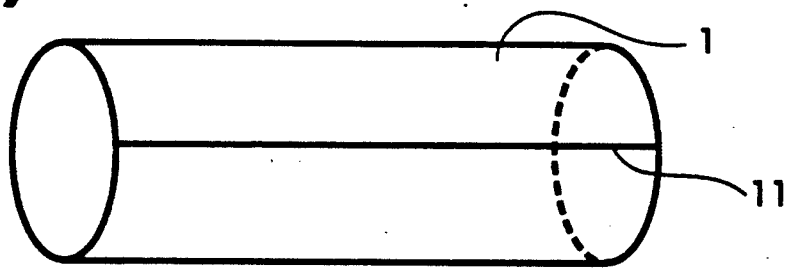
FIG. 9 is a schematic perspective view showing an example of a mark provided on the side surface of a semiconductor crystal ingot.

To ease the cutting for forming the above OF, a mark indicating a cutting position may be provided to the side of a semiconductor crystal ingot before it is sliced into disks. As shown in FIG. 9, such a mark is a mark 11 composed, for example, of a straight shallow groove (marking-off) defined or produced on the side of a cylindrically processed ingot 1 in parallel with the axis thereof. Mark 11 is defined to be related to a crystallographic direction of the ingot 1. Further, the groove-shaped mark 11 is defined as shallow as possible so long as it does not disappear when the side of the semiconductor wafer is beveled later and does not remain in the effective surface area of the wafer after being beveled. Thus, since the mark is so small the mark does not affect the surface flatness in the processes of the above surface grinding and polishing. The groove may be formed by using a laser beam. The mark may be drawn with waterproof ink. Further, when two marks each composed of straight shallow grooves or the like are provided on the side of the ingot 1, the OF can be easily formed in such a manner that the semiconductor wafer is cut off along the line connecting these two marks.

A process of fabricating an SOI substrate composed of two bonded semiconductor wafers will be described next with reference to FIGS. 10A to 10E. Two wafers each having at least one surface chemically-mechanically polished in accordance with steps (a)-(g) of FIG. 2 are prepared. Note that a mark indicating the crystallographic direction is formed on the side of each of these wafers in advance, as described above.

Figure 10A:
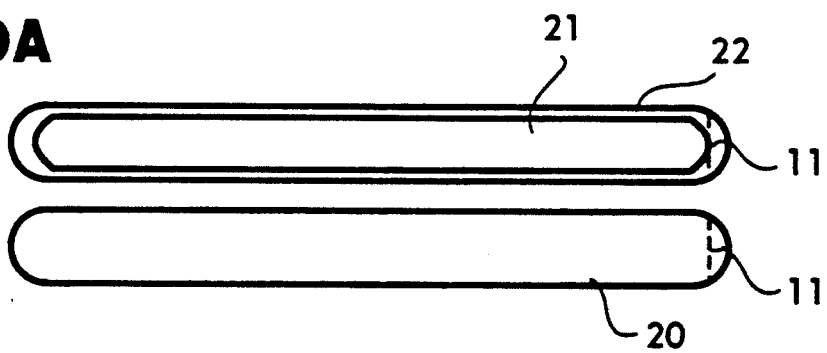
FIGS. 10A to 10E are diagrams explaining a process for fabricating an SOI substrate according to the present invention.
Figure 10B:
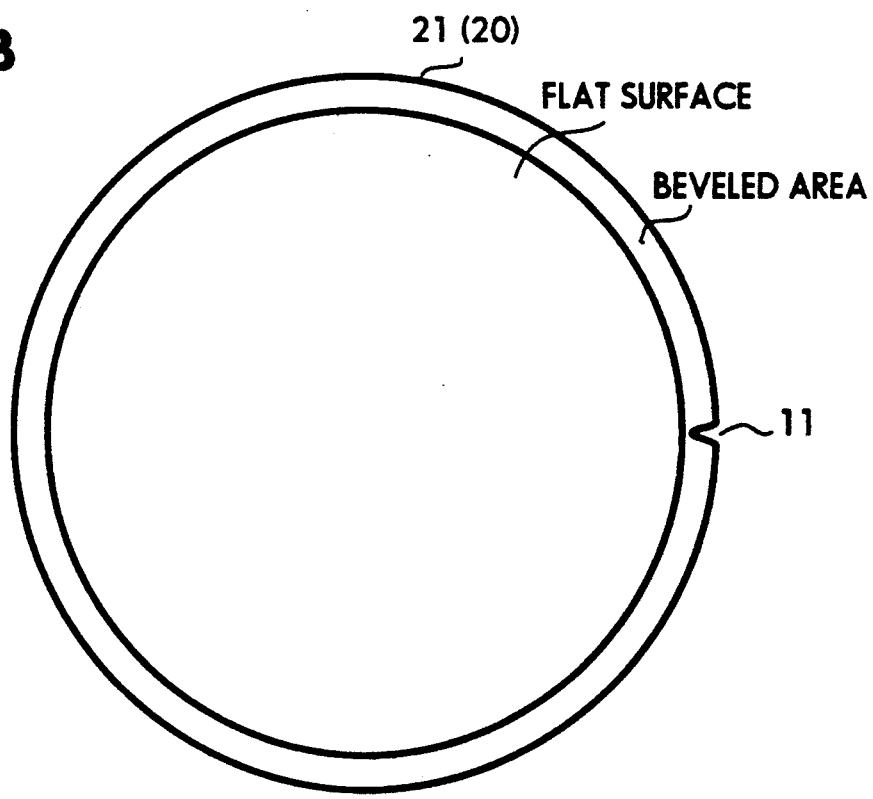

Next, as shown in FIG. 10A, an oxide film 22 having a thickness of about 1 micrometer is formed to the surface of at least one of the above two wafers 20, 21 by, for example, a known thermal oxidization method. Then, these silicon wafers 20 and 21 are overlapped so that the above polished surfaces thereof confront or are in contact with each other and subjected to a heat treatment in a nitrogen gas atmosphere at 1100° C. To increase a bonding force, a method of imposing a pulse voltage between the silicon wafers 20, 21 prior to the heat treatment is also known. Thus, the silicon wafer 20 is strongly bonded to the silicon wafer 21 through the oxidized film 22. Note that when the silicon wafers 20 and 21 are overlapped, the crystallographic directions thereof are aligned with each other on the basis of the above mark 11 left on each side. FIG. 10B is a plan view of the overlapped silicon wafers 20 and 21, wherein a circular flat surface and a beveled region therearound are shown.

Figure 10C:
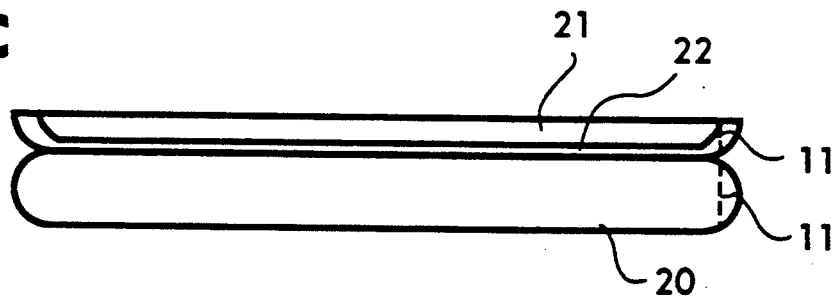
Figure 10D:
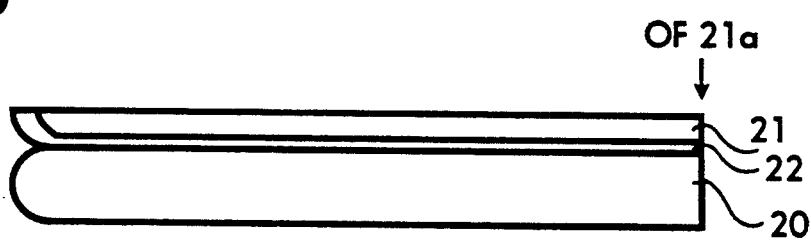
Figure 10E:
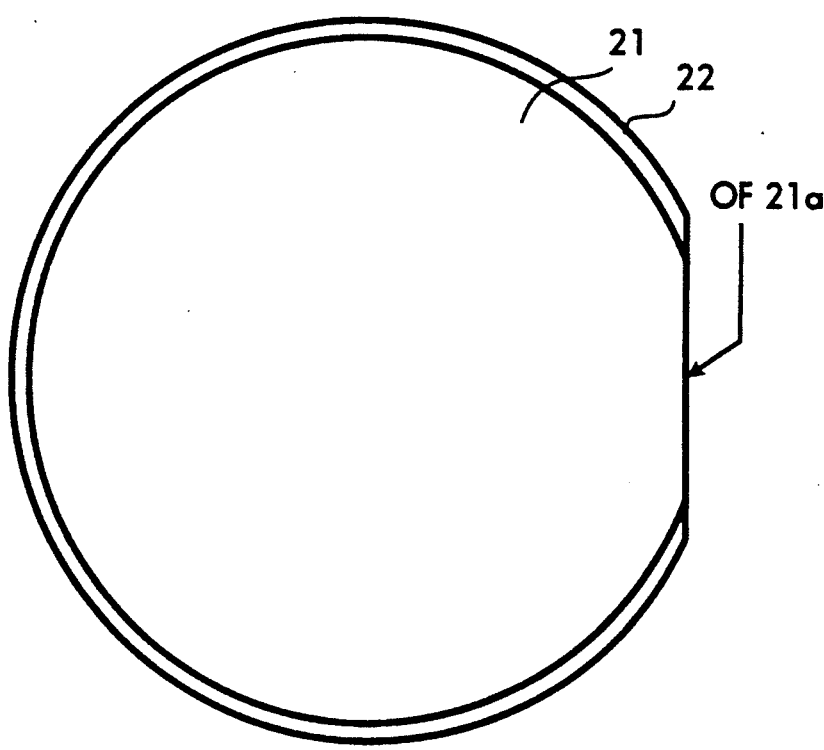

Next, for example, the silicon wafer 21 is surface ground to a thickness of 3 to 4 micrometers and further chemically-mechanically polished unit it is uniformly thinned to 2 micrometers, as shown in FIG. 10C. Thereafter, as shown in FIG. 10D and FIG. 10E a corresponding plan view, the silicon wafers 20, 21 are cut on the basis of the mark 11 left on the side of the silicon wafer 20 to form an OF 21a. The mark on the side of the silicon wafer 21 may disappear at the steps when the oxide film 22 is formed and when the wafer is thinned by being surface ground or polished as described above. Therefore, when the crystallographic directions of the silicon wafers 20 and 21 are aligned with each other at the step of overlapping them as described above, the crystallographic direction of the silicon wafer 21 can be found from the OF 21a. With this arrangement, an SOI substrate is completed which is composed of a single silicon crystal layer of 2 micrometers thick supported by a semiconductor wafer of several hundreds of micrometers thick through an insulating layer.

Figure 11A:
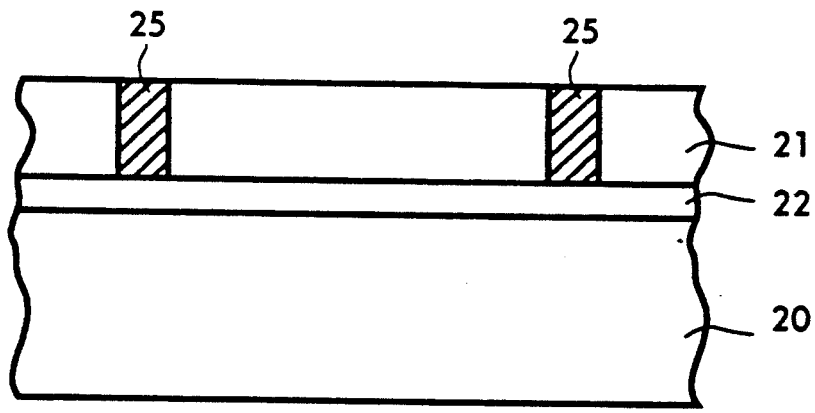
FIGS. 11A to 11C are schematic cross-sectional views explaining a process for fabricating a semiconductor device composed of a semiconductor wafer according to the present invention.

A semiconductor device is formed on the semiconductor wafer fabricated in accordance with the process shown in FIG. 2 or on the SOI substrate fabricated in accordance with the process with reference to FIGS. 10A to 10E. An embodiment thereof will be described with reference to the case in which the above SOI substrate is used. FIG. 11A is an enlarged portion of the SOI substrate shown in FIG. 10D. An isolation region 25 is formed around a device region defined on the surface of the silicon wafer 21 made to the thickness of 2 micrometers in the substrate. The isolation region 25 may be any arbitrary structure such as a field oxide formed by a known local oxidation of silicon (LOCOS) method or a trench or cavity reaching the oxide film 22.

Figure 11B:
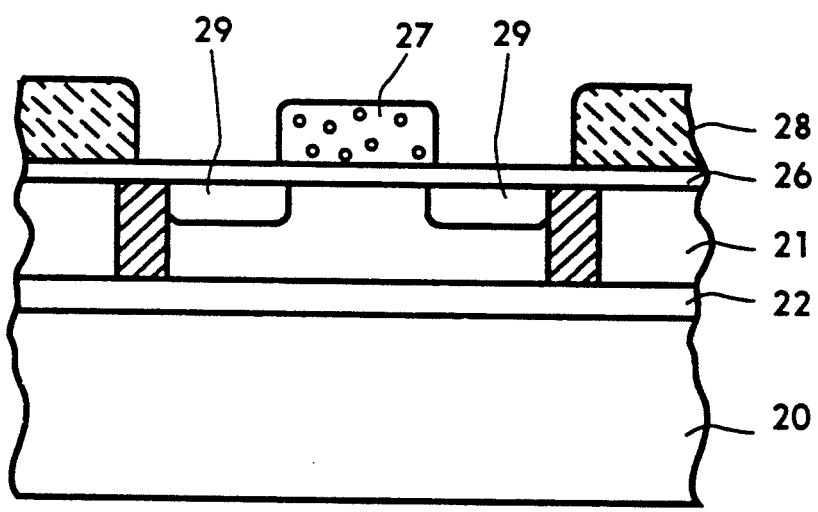

Next, the surface of the silicon wafer 21 exposed at each device region is thermally oxidized to form a gate insulating film 26 of about 200 angstroms thick, as shown in FIG. 11B. Then, a gate electrode 27 composed, for example, of a polysilicon layer is formed using a known chemical vapor deposition (CVD) and lithography. Further, a resist mask 28 is formed on the surface of the SOI substrate to expose a predetermined device region and impurities such as arsenic (As) or the like are ion implanted to the silicon wafer 21 exposed from the resist mask 28 and gate electrode 27 to from a source/drain region 29.

Figure 11C:
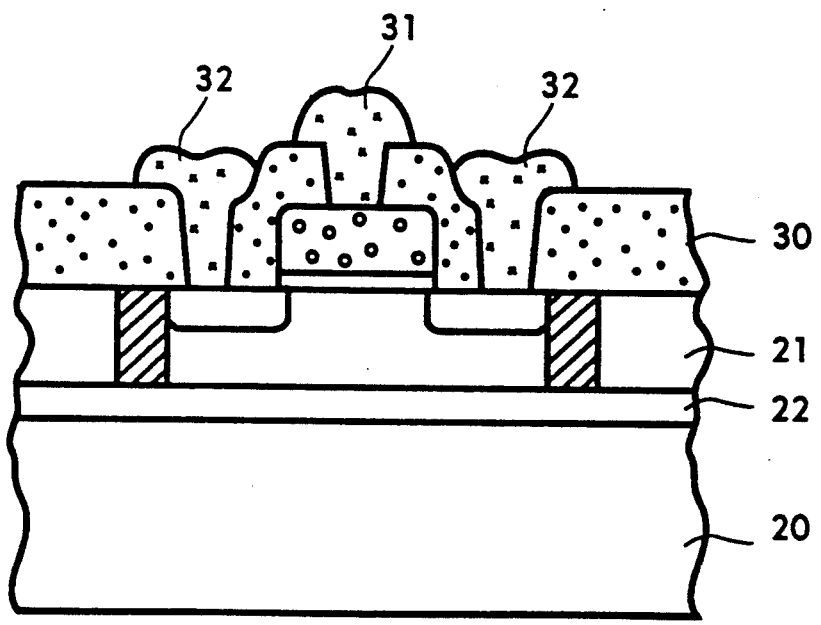

Next, as shown in FIG. 11C, an insulating layer 30 composed, for example, of phosphosilicate glass (PSG) is formed on the surface of the SOI substrate and a contact hold is formed at a predetermined position of the insulating layer 30. Thereafter, an aluminium layer 35 is deposited on the insulating layer 30 and patterned by a known lithography method to thereby form gate wiring 31 and source/drain electrode 32 as shown FIG. 11C, whereby a metal insulator semiconductor field effect transistor (MISFET) of an SOI structure is completed.

It is needless to say that the OF 21a (FIG. 10C) of the SOI substrate is indispensable to align the mask with the SOI substrate during the lithography step.

As described above, according to the method of fabricating a semiconductor wafer of the present invention, a surface having a large area can be more easily fattened as compared with a conventionally known method by which polishing is carried out after dummy or extra members having a thickness similar to that of a member to be processed having been disposed therearound to increase effective productivity of the substrate. More specifically, in the above conventional method, the dummy or extra members must have a thickness and material similar to those of the member to be processed and many man-hours are needed to spread the dummy members all around the member to be processed. Further, these dummy members cannot be reused. Therefore, the present invention is excellent in cost and mass-productivity.

As apparent from the above description, the method of manufacturing a semiconductor wafer according to the present invention is effective regardless of the size and material of the wafer. Further, it is needless to say that the SOI substrate according to the present invention is applicable not only to the manufacture of the MISFET as in the above embodiment but also to the manufacture of a bipolar transistor, a semiconductor device having a so-called Bi-MOS structure in which MISFETs and bipolar transistors are both provided, and an integrated circuit composed of any of these devices.

What is claimed is:

1. A method of manufacturing a semiconductor substrate, comprising the steps of:
    (a) forming an ingot composed of semiconductor crystal and having a cylindrical shape with a cylindrical surface;
    (b) slicing said ingot into a disk having circular surfaces, a center and a circumference;
    (c) applying a mechanical flattening to at least one of said circuit surfaces to produce a flattened circular surface; and
    (d) producing, after performing steps (a)–(c), a cutout of a portion of said disk at the circumference of said disk so that said disk is rotationally asymmetric with respect to an axis passing through the center of said disk and perpendicular to the flattened circular surface.

2. A method of manufacturing a semiconductor substrate according to claim 1, wherein said applying in step (c) flattens at least one of said circular surfaces with rotary grinding.

3. A method of manufacturing a semiconductor substrate according to claim 1, wherein said producing of the cutout in step (d) comprises cutting said disk along a straight line connecting two points on the circumference of said disk.

4. A method of manufacturing a semiconductor substrate according to claim 1,
    wherein said ingot has a rotationally symmetric axis of the cylindrical surface.
    wherein said method further comprises the step of (e) forming a straight mark parallel to the rotationally symmetric axis of said ingot on the cylindrical surface of said ingot prior to slicing said ingot in step (b), and
    wherein said producing of the cutout is based on a mark on the circumference of said disk produced from the straight mark when said ingot is sliced in step (b).

5. A method of manufacturing a semiconductor substrate according to claim 1,
    wherein said ingot has a rotationally symmetric axis of the cylindrical surface,
    wherein said method further comprises the step of (e) forming two straight marks parallel to the rotationally symmetric axis of said ingot on the cylindrical surface of said ingot prior to slicing said ingot in step (b), and
    wherein said producing of the cutout is based on two marks on the circumference of said disk produced from the two straight marks when said ingot is sliced in step (b).

6. A method of manufacturing a semiconductor substrate according to claim 1, further comprising the step of (e) beveling the circumference of said disk prior to the step of said applying the mechanical force in step (c) to at least one of the circular surfaces.

7. A method of manufacturing a semiconductor substrate according to claim 4, wherein said producing of the straight mark comprises scanning a laser beam on the cylindrical surface of said ingot.

8. A method of manufacturing a semiconductor substrate according to claim 1, further comprising the step of (e) mirror finishing said flattened circular surface.

9. A method of manufacturing a semiconductor substrate according to claim 8, wherein said mirror finishing in step (e) is performed by chemical-mechanical polishing.

10. A method of manufacturing a semiconductor device, comprising the step of:
(a) forming an ingot composed of semiconductor crystal and having a cylindrical shape;
(b) slicing said ingot into disks having circular surfaces, a center and a circumference;
(c) flattening at least one of said circular surfaces on each of a first disk and a second disk to produce at least one flattened circular surface on each of said first and second disks;
(d) mirror finishing said at least one flattened circular surface of each of said first and second disks to produce at least one mirror finished surface on each of said first and second disks;
(e) forming an insulating layer on said at least one mirror finished surface of at least one of said first and second disks;
(f) bonding said at least one mirror finished surface on each of said first and second disks with intervention of said insulating layer therebetween;
(g) thinning said first disk after said bonding in step (f), to expose a working surface of said first disk;
(h) producing a cutout of a portion of said first and second disks at the circumference of each of said first and second disks after said thinning of said first disk in step (g), so that said first and second disks are rotationally asymmetric with respect to an axis passing through the center of said first disk and perpendicular to the working surface of said first disk;
(i) mirror finishing the working surface of said first disk to produce a mirror finished working surface of said disk; and
(i) introducing impurities into a predefined region of the mirror finished working surface of said first disk.

11. A method of manufacturing a semiconductor substrate according to claim 5, wherein said producing of the two straight marks comprises scanning a laser beam on the cylindrical surface of said ingot.

12. A method of manufacturing a semiconductor substrate, comprising the steps of:
(a) forming an ingot composed of semiconductor crystal and having a cylindrical shape;
(b) slicing said ingot into a disk having surfaces and a circumference;
(c) applying a mechanical flattening to at least one of said surfaces to produce at least one flattened surface; and
(d) cutting after said flattening in step c, at least one portion of said disk at the circumference of said disk having said at least one flattened surface.

* * * * *

UNITED STATES PATENT AND TRADEMARK OFFICE
CERTIFICATE OF CORRECTION

PATENT NO.   : 5,227,339
DATED        : July 13, 1993
INVENTOR(S)  : Sadahiro KISHII It is certified that error appears in the above-identified patent and that said Letters Patent is hereby corrected as shown below:

Col. 10, line 9, change "(i)" to --(j)--.

Signed and Sealed this

Twelfth Day of April, 1994

Attest:

BRUCE LEHMAN

Attesting Officer

Commissioner of Patents and Trademarks